United States Patent [19]

Kaufman

[11] Patent Number: 4,630,174

[45] Date of Patent: * Dec. 16, 1986

[54] CIRCUIT PACKAGE WITH EXTERNAL CIRCUIT BOARD AND CONNECTION

[76] Inventor: Lance R. Kaufman, 131 N. White Oak Way, Mequon, Wis. 53092

[*] Notice: The portion of the term of this patent subsequent to Aug. 19, 1997 has been disclaimed.

[21] Appl. No.: 546,990

[22] Filed: Oct. 31, 1983

[51] Int. Cl.⁴ .............................................. H05K 1/18
[52] U.S. Cl. ............................... 361/388; 174/52 FP; 361/386; 361/412; 361/421
[58] Field of Search .................... 339/17 LM, 17 M; 174/52 FP; 361/386, 388, 412, 413, 421

[56] References Cited

U.S. PATENT DOCUMENTS

| | | | |
|---|---|---|---|
| 2,915,680 | 12/1959 | Kong | 339/17 M X |
| 3,324,353 | 6/1967 | Retzlaff et al. | 361/412 X |
| 3,731,254 | 5/1973 | Key | 174/52 FP X |
| 3,789,341 | 1/1974 | Dalmasso | 174/52 FP X |
| 3,801,938 | 4/1974 | Goshgarian | 174/52 FP X |
| 3,898,594 | 8/1975 | Hochberg et al. | 174/52 FP X |
| 3,958,075 | 5/1976 | Kaufman | 174/16 NS |
| 4,156,148 | 5/1979 | Kaufman | 357/19 X |
| 4,158,745 | 6/1979 | Keller | 174/52 FP |
| 4,196,411 | 4/1980 | Kaufman | 338/314 |
| 4,204,248 | 5/1980 | Proffit et al. | 361/388 |
| 4,215,235 | 7/1980 | Kaufman | 174/52 PG |
| 4,218,724 | 8/1980 | Kaufman | 361/395 |
| 4,237,435 | 12/1980 | Cooper et al. | 361/395 X |
| 4,250,481 | 2/1981 | Kaufman | 338/163 |
| 4,257,091 | 3/1981 | Kaufman | 363/85 |
| 4,266,140 | 5/1981 | Kaufman | 357/19 X |
| 4,351,580 | 9/1982 | Kirkman et al. | 174/52 FP X |
| 4,394,530 | 7/1983 | Kaufman | 361/388 X |
| 4,436,951 | 3/1984 | Rief et al. | 361/388 X |

FOREIGN PATENT DOCUMENTS 2840514  3/1979  Fed. Rep. of Germany .

Primary Examiner—R. R. Kucia
Attorney, Agent, or Firm—Andrus, Sceales, Starke & Sawall

[57] ABSTRACT

A circuit package 2 is provided for heat dissipating power semiconductors and the like. Circuit means 10, including lead frames 12 and power conditioning components 13, is mounted on an electrically insulating thermally conductive substrate 4 and covered by an electrically insulating housing 6. Power lead frames 14 extend integrally externally of the housing 6 and have external portions 22 bent laterally across the to surface of the housing 6 to cooperate with terminal connection means 28 there below in the top wall 24 of the housing 6. Internal connection means 50 is provided for selectively connecting a peripheral power lead frame portion 46 to a central portion 52 of circuit means 10 and insulatively bypassing designated portions 54 of circuit means 10 therebetween. In one embodiment, circuit package 2 is provided in combination with an external printed circuit board 40 extending across the top surface 24 of the housing and connected to control lead frames 18 and power lead frames 14.

1 Claim, 8 Drawing Figures

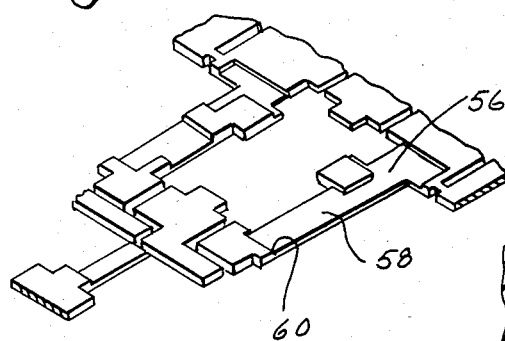
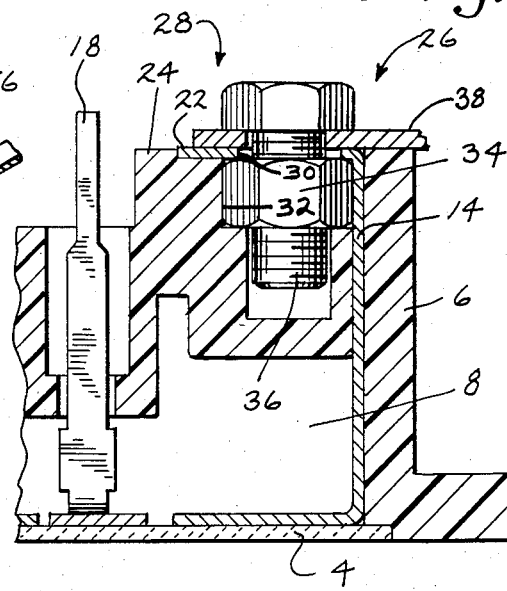
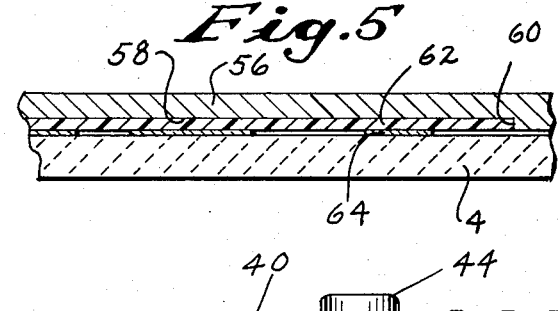
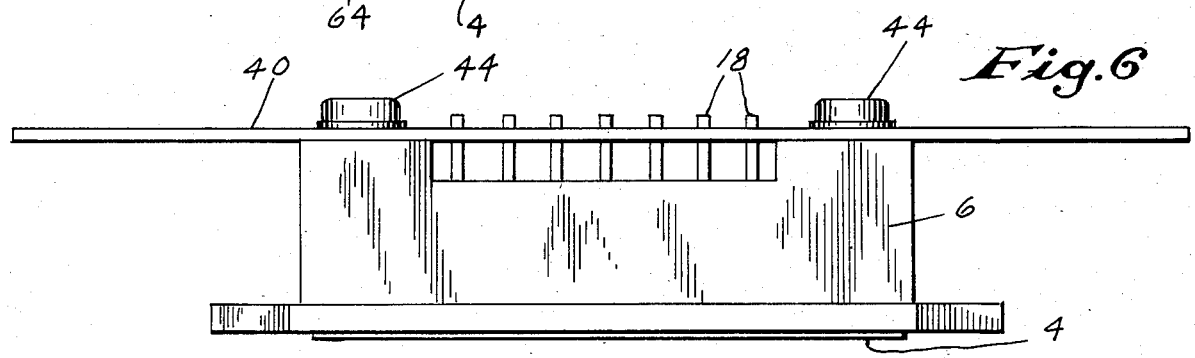
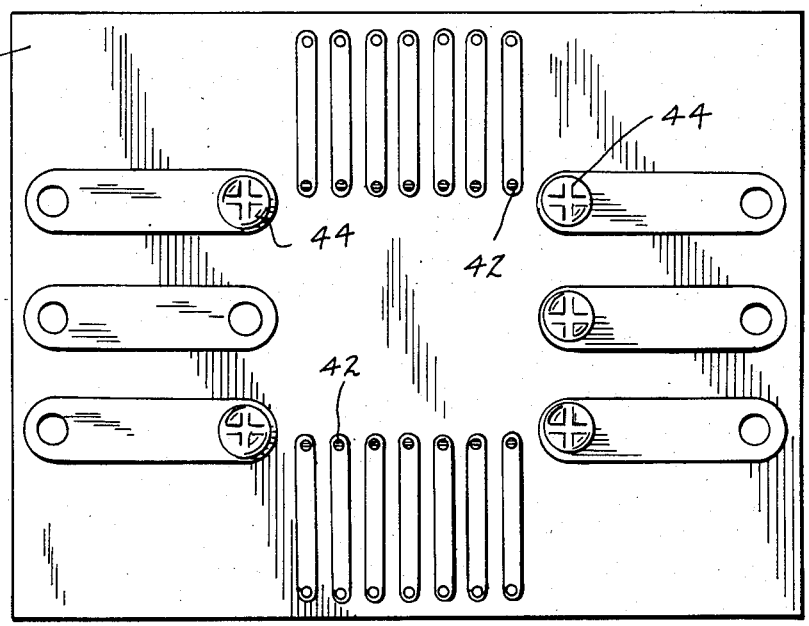

CIRCUIT PACKAGE WITH EXTERNAL CIRCUIT BOARD AND CONNECTION

BACKGROUND AND SUMMARY

The invention relates to a circuit package for power semiconductor components, and more particularly to a package which provides interconnection design flexibility yet still maintains high heat dissipation capability.

Heat dissipating power conditioning components, such as SCR's, triacs, transistors, MOSFETs, and rectifying bridges, are typically mounted on an electrically insulating thermally conductive substrate, such as rigid ceramic, together with lead frame means and conductive films or the like constituting a hybrid circuit. An electrically insulating housing covers the substrate and the circuit means from above. A heat sink may be clamped to the bottom of the housing to intimately contact the bottom side of the ceramic substrate to dissipate the heat generated by the power conditioning components, all as is well known.

The present invention provides improvements in the lead frame and housing structure. The lead frame structure includes control lead frames for carrying gating signals and the like, and higher capacity power lead frames for carrying the main or rated current. The power lead frames extend from the circuit components on the substrate integrally upwardly beyond the top of the housing and include portions bent laterally across the top external surface of the housing for cooperating with terminal connection means in the top housing wall therebelow. The power lead frames provide a continuous integral electrical connection without intermediate discreet connectors, eliminating additional junctions which otherwise present additional thermal barriers reducing thermal conductivity efficiency.

In one embodiment, the improved lead frame and housing structure is provided in combination with an external printed circuit board extending laterally across the top of the housing. The control lead frames extend integrally upwardly beyond the top of the housing and are connected to the external printed circuit board. The laterally bent external portions of the power lead frames cooperate with attachment means in the top wall of the housing and power terminal portions of the external printed circuit board, and are clamped between the latter two.

The present invention also facilitates internal interconnection of the circuit means on the substrate. The lead frames have portions extending along the substrate, and portions extending normal to the substrate from a given periphery. Connection means are provided for selectively connecting a peripheral lead frame portion on said substrate to a central portion of the circuit means on the substrate within the boundary of the noted periphery and insulatively bypassing designated portions of the circuit means therebetween. A central lead frame has its underside partially etched to a given depth to accomodate a layer of insulation between the central lead frame and printed circuits therebeneath on the substrate. An electrically conductive bridge is jumpered between the central lead frame and a peripheral lead frame portion for passing above a designated power conditioning component in spaced apart relation.

BRIEF DESCRIPTION OF THE DRAWINGS

FIG. 4 is a sectional view through a portion of FIG. 1 showing the laterally bent external power lead frame portion and power terminal attachment means.

FIG. 5 is a sectional view of a portion of FIG. 2 along line 5—5.

FIG. 6 is a side elevational view of the package of FIG. 1, after lateral bending of the external power lead frame portions, and in combination with an external printed circuit board.

FIG. 7 is a top elevational view of the external circuit board of FIG. 6.

FIG. 8 is an isolated isometric view from below of the lead frame stamping affording the lead frames of FIGS. 2 and 3, showing underside sections which are partially etched to a given depth to accommodate a layer of insulation as shown in FIG. 5.

DETAILED DESCRIPTION

Figure 1:
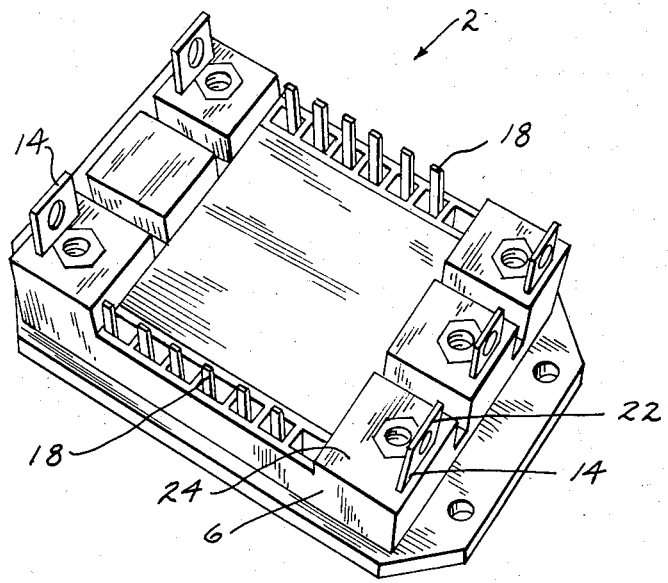
FIG. 1 is an isometric view of a circuit package constructed in accordance with the invention, including the housing, but before lateral bending of the external power lead frame portions.

Referring to FIGS. 1 through 4, there is shown a circuit package 2 including an electrically insulating thermally conductive substrate 4, such as a rigid piece of ceramic, and an electrically insulating housing 6 having a downwardly opening cavity 8, FIG. 4, covering substrate 4. Circuit means 10 is mounted on the top side of substrate 4. Circuit means 10 includes lead frame means 12 and power conditioning components such as 13, for example SCR's triacs, transistors, MOSFETs, and rectifier bridges. There may be thin film printed circuits formed on the substrate, followed by soldering of portions of the lead frame means to the substrate, followed by soldering or other bonding of the power conditioning components such as 13 to portions of the lead frame means. Housing 6 may be clamped to a finned heat sink or the like (not shown) such that the bottom side of substrate is in intimate abutting heat transfer relation with the heat sink.

Figure 2:
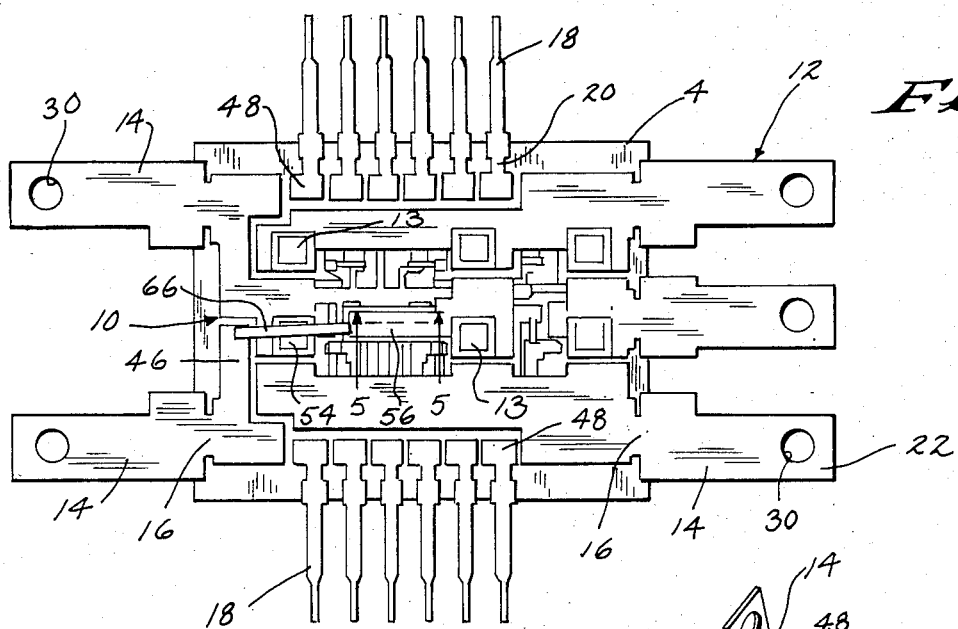
FIG. 2 is a top elevational view of the circuit package of FIG. 1 with the housing removed, showing the substrate and circuit means, including the power conditioning components and the lead frames, but before upward bending of the latter.

Lead frame means 12 is formed from a single stamped sheet of preformed pattern overlaid on substrate 4 and bonded thereto. FIG. 2 shows the stamped sheet after cutting. Lead frame means 12 includes a plurality of power lead frames 14 bent upwardly at bend line 16 and extending from substrate 4 upwardly through cavity 8 and integrally externally of housing 6 for circuit connection. Lead frame means 12 also includes a plurality of gating or control lead frames 18 bent upwardly at bend line 20 and extending from substrate 4 upwardly through cavity 8 and integrally externally of housing 6 for circuit connection. One or more control lead frames 18 may optionally be terminated below or flush with the top of the housing and adapted for fast-on terminal connection.

Power lead frames 14 extend integrally upwardly beyond the top of housing 6 and include portions such as 22 bent laterally across the top external surface 24, FIG. 4, of housing 6 to cooperate with terminal connection means 26, to thus provide a continuous link between terminal connection means 26 and circuit means 10 on substrate 4. Terminal connection means 26 includes attachment means 28 extending through an aperture 30 in external laterally bent lead frame portion 22 and into a recess 32 in the top surface or wall 24 of housing 6 therebelow. Attachment means 28 includes retaining means such as a nut 34 nonrotatably disposed or embedded in recess 32 for receiving a threaded screw 36 through aperture 30 in the external laterally bent lead frame portion 22 to tightly secure and clamp the latter into engagement with a connector or power terminal 38 through which screw 36 also extends.

In the embodiment of FIGS. 6 and 7, circuit package 2 is provided in combination with an external printed circuit board extending laterally across the top of housing 6. Control lead frames 18 extend integrally upwardly beyond the top of housing 6 and through apertures 42 in external printed circuit board 40 for connection thereto. The laterally bent power lead frame external portions 22 cooperate with attachment means 28 in the top wall of the housing as before and are connected to designated power terminal portions 44 of printed circuit board 40.

Figure 3:
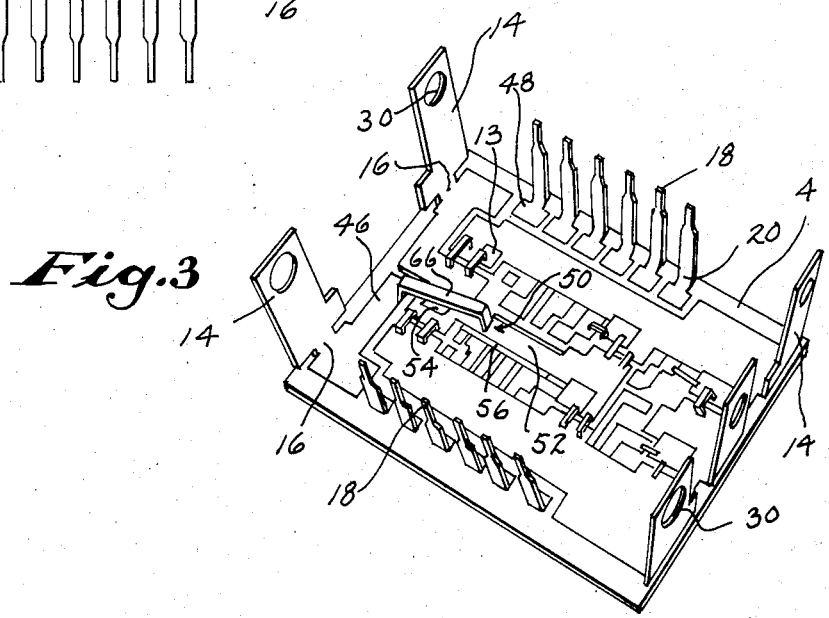
FIG. 3 is an isometric view of the substrate and circuit means of FIG. 2, after upward bending of the lead frames, prior to insertion into the housing.

Referring to FIG. 3, lead frames have portions such as 46 and 48 extending from substrate 4 at a given periphery. Connection means 50 is provided for selectively connecting a peripheral power lead frame portion such as 46 to a central portion such as 52 of circuit means 10 within the boundary of the noted periphery and insulatively bypassing designated portions such as 54 of circuit means 10 therebetween. Connection means 50 includes a central lead frame 56 having its underside 58, FIGS. 5 and 8, etched to a given depth 60 to accommodate a layer of insulation 62 between central lead frame 56 and printed circuits 64 therebeneath on substrate 4. Electrically conductive bridge 66 is jumpered between central lead frame 56 and peripheral power lead frame portion 46 for passing above a designated power conditioning component such as 54 in spaced apart relation.

The lead frames 12 are formed from a single stamped sheet of preformed pattern overlaid on substrate 4 and bonded thereto, and include at least one designated section such as 58 etched to a given depth from a facing side. Designated section 58 is removed from the stamped sheet and bonded to substrate 4 within the noted periphery, with etched side 58 facing substrate 4 and spaced therefrom by layer of insulation 62.

It is recognized that various modifications are possible within the scope of the appended claims.

I claim:
1. A circuit package comprising:
an electrically insulating thermally conductive substrate having a top surface and a bottom surface;
an electrically insulating housing covering said substrate and having a top wall spaced above said top surface of said substrate and having sidewalls depending downwardly from said top wall to said substrate to enclose and define a cavity bounded on the top by said top wall and on the sides by said sidewalls and on the bottom by said top surface of said said substrate;
circuit means, including power conditioning components and lead frame means, mounted on said top surface of said substrate, said lead frame means integrally extending away from said top surface of said substrate through said cavity and integrally externally of said housing beyond said top wall of said housing;
a printed circuit board external to said housing and extending laterally across the exterior of said top wall of said housing and connected to portions of said integrally extending lead frame means external to said housing, to thus provide a continuous electrical link from said circuit means on said substrate to said external printed circuit board without intermediate junctions between discrete connectors;
wherein said external printed circuit board has apertures therethrough, and said lead frame means includes portions extending through said apertures;
wherein said lead frame means includes other external portions bent laterally across said top wall of said housing and beneath said external printed circuit board;
and comprising terminal connection means including retaining means in said top wall of said housing below said laterally bent other external portions of said lead frame means and below said printed circuit board, said terminal connection means including attachment means extending through said printed circuit board, through said laterally bent other external portions of said lead frame means and into a recess in said top wall of said housing to engage said retaining means to clamp said printed circuit board and said laterally bent other external portions of said lead frame means into engagement.

* * * * *